United States Patent
Wang et al.

(10) Patent No.: US 9,853,614 B2
(45) Date of Patent: Dec. 26, 2017

(54) AMPLIFIER WITH TRIPLE-COUPLED INDUCTORS

(71) Applicant: QUALCOMM Incorporated, San Diego, CA (US)

(72) Inventors: Chuan Wang, San Diego, CA (US); Dongling Pan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/560,285

(22) Filed: Dec. 4, 2014

(65) Prior Publication Data

US 2016/0164476 A1    Jun. 9, 2016

(51) Int. Cl.
| | |
|---|---|
| *H03F 3/191* | (2006.01) |
| *H03F 1/56* | (2006.01) |
| *H03F 3/19* | (2006.01) |
| *H03F 1/22* | (2006.01) |
| *H03F 3/193* | (2006.01) |
| *H03F 3/30* | (2006.01) |

(52) U.S. Cl.
CPC ............. *H03F 1/565* (2013.01); *H03F 1/223* (2013.01); *H03F 3/19* (2013.01); *H03F 3/193* (2013.01); *H03F 3/3022* (2013.01); *H03F 2200/294* (2013.01); *H03F 2200/451* (2013.01); *H03F 2200/541* (2013.01)

(58) Field of Classification Search
CPC ...................................................... H03F 3/191
USPC .......................................... 330/302, 305, 311
See application file for complete search history.

(56) References Cited

U.S. PATENT DOCUMENTS

| | | | | |
|---|---|---|---|---|
| 4,845,445 A | * | 7/1989 | Rinderle ............... | H03J 3/185 330/305 |
| 6,407,640 B1 | * | 6/2002 | Aparin ................. | H03F 1/22 330/302 |
| 6,897,732 B2 | * | 5/2005 | Iwai ..................... | H03F 1/0266 330/296 |
| 6,940,365 B2 | * | 9/2005 | Kamata ................ | H03F 3/191 333/17.1 |
| 7,323,939 B2 | * | 1/2008 | Han ..................... | H03F 1/223 330/305 |
| 7,616,061 B2 | * | 11/2009 | Cha ...................... | H03F 1/223 330/126 |
| 7,714,662 B2 | * | 5/2010 | Jeong ................... | H03F 1/223 330/126 |

(Continued)

FOREIGN PATENT DOCUMENTS

WO    2014189990 A1    11/2014

OTHER PUBLICATIONS

International Search Report and Written Opinion for International Application No. PCT/US2015/060801, ISA/EPO, dated Jan. 1, 2016, 10 pages.

*Primary Examiner* — Henry Choe
(74) *Attorney, Agent, or Firm* — Qualcomm Incorporated—Toler

(57) ABSTRACT

An apparatus includes an amplifier and a first inductor coupled to an input of the amplifier. The apparatus also includes a second inductor that is inductively coupled to the first inductor and that couples the amplifier to a first supply node. The apparatus further includes a third inductor that is inductively coupled to the first inductor and to the second inductor and that couples the amplifier to a second supply node.

20 Claims, 8 Drawing Sheets

(56) References Cited

U.S. PATENT DOCUMENTS

| | | | |
|---|---|---|---|
| 7,755,435 B2 * | 7/2010 | Lu | H03F 1/223 |
| | | | 330/311 |
| 8,102,213 B2 | 1/2012 | Tasic et al. | |
| 8,229,367 B2 | 7/2012 | Chan et al. | |
| 8,279,018 B1 | 10/2012 | Song et al. | |
| 8,760,240 B2 | 6/2014 | Yehezkely | |
| 2004/0111681 A1 | 6/2004 | Lu et al. | |
| 2013/0234799 A1 | 9/2013 | Gudem et al. | |
| 2014/0125417 A1 * | 5/2014 | Sutardja | H03F 1/223 |
| | | | 330/296 |
| 2014/0240048 A1 | 8/2014 | Youssef et al. | |
| 2014/0253242 A1 | 9/2014 | Youssef et al. | |
| 2016/0072456 A1 * | 3/2016 | Lin | H03F 1/26 |
| | | | 330/303 |
| 2016/0233843 A1 * | 8/2016 | Chan | H03G 3/3042 |

* cited by examiner

AMPLIFIER WITH TRIPLE-COUPLED INDUCTORS

I. FIELD

The present disclosure is generally related to electronics, and more specifically to radio frequency integrated circuits (RFICs).

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Radio frequency integrated circuits (RFICs) are used in wireless devices. RFICs may include multiple low noise amplifiers (LNAs) and may accommodate multiple frequency bands for different communications channels (e.g., a cellular band or a wifi band). One example of a multiple band RFIC supports the ultra-high frequency band (UHB) and the long-term evolution (LTE) frequency band. Multiband RFICs include a switching capability to select one of the multiple frequency bands for operation. In addition, while RFIC performance is impacted by impedance matching and while LNAs within the RFIC may be required to meet performance and linearity specifications to satisfy industry standards (e.g., to perform carrier aggregation and signal processing), there is limited integrated circuit chip area available for electromagnetic energy-type devices, such as inductors and transformers (due to the goal of reducing device size and power consumption).

III. BRIEF DESCRIPTION OF THE DRAWINGS

IV. DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Figure 1:
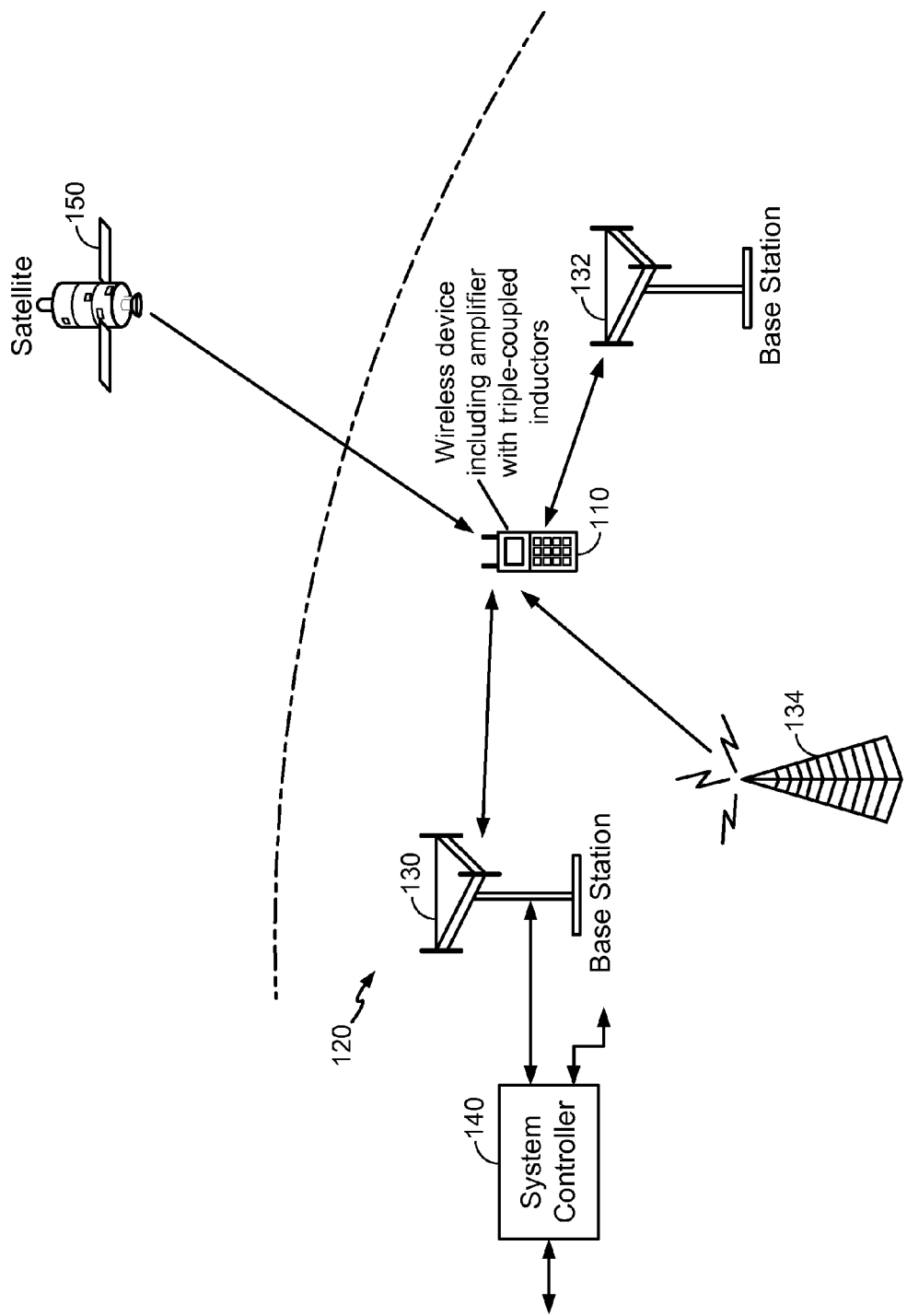
FIG. 1 shows a wireless device communicating with a wireless system.

FIG. 1 shows a wireless device 110 communicating with a wireless communication system 120. Wireless communication system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless system may include any number of base stations and any set of network entities.

Wireless device 110 may also be referred to as user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with wireless system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1x, EVDO, TD-SCDMA, GSM, 802.11, etc. In an exemplary embodiment, the wireless device 110 may include an integrator.

Furthermore, in an exemplary embodiment, the wireless device 110 may include an amplifier with triple-coupled inductors, as further described herein. The amplifier may include or may be coupled to circuitry that enables switching the wireless device 110 between multiple frequency bands.

Figure 2:
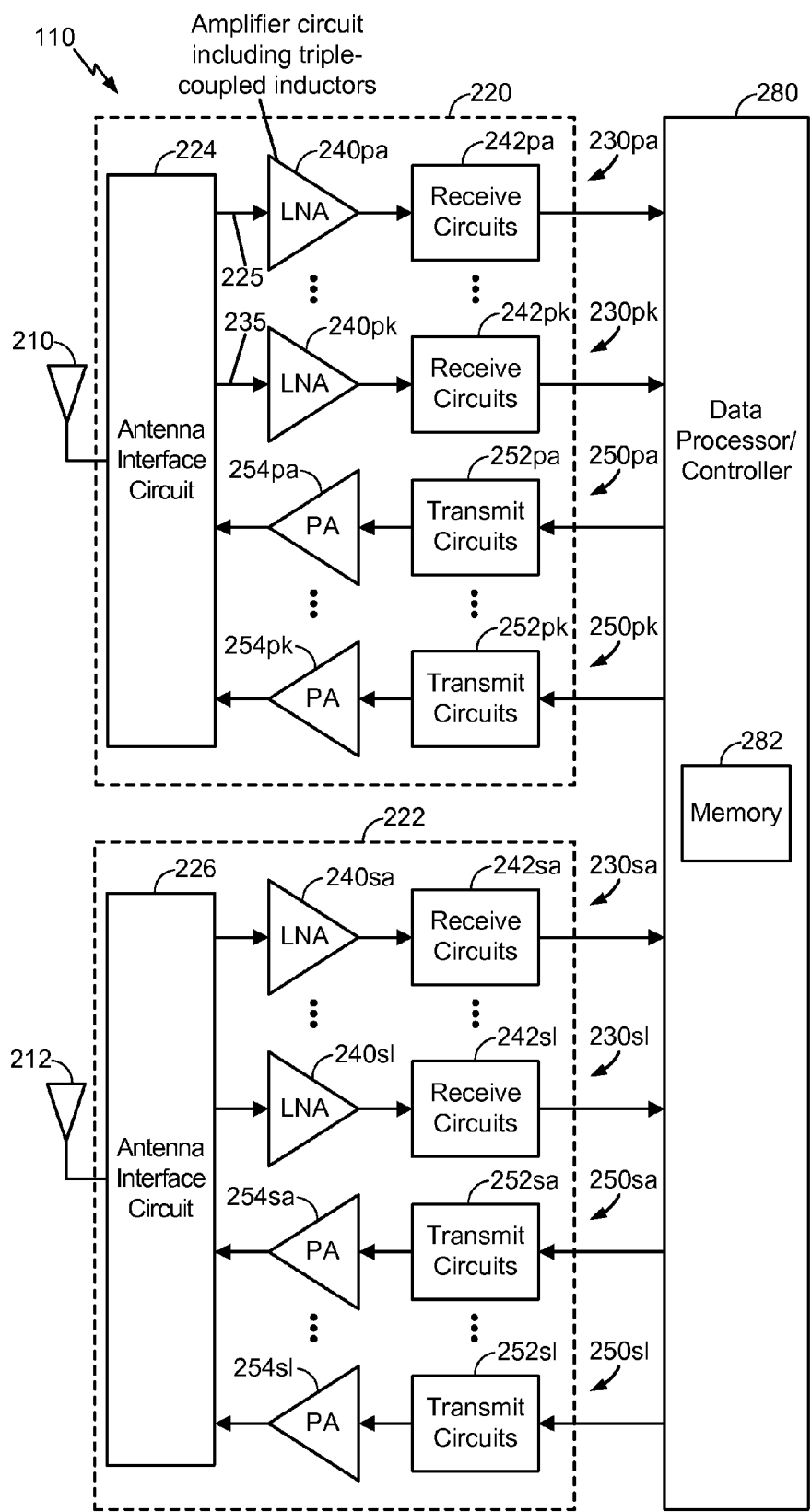
FIG. 2 shows a block diagram of the wireless device in FIG. 1.

FIG. 2 shows a block diagram of an exemplary design of wireless device 110 in FIG. 1. In this exemplary design, wireless device 110 includes a transceiver 220 coupled to a primary antenna 210, a transceiver 222 coupled to a secondary antenna 212 via an antenna interface circuit 226, and a data processor/controller 280. Transceiver 220 includes multiple (K) receivers 230pa to 230pk and multiple (K) transmitters 250pa to 250pk to support multiple frequency bands, multiple radio technologies, carrier aggregation, etc.

Transceiver 222 includes multiple (L) receivers 230sa to 230sl and multiple (L) transmitters 250sa to 250sl to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 2, each receiver 230 includes an LNA 240 and receive circuits 242. For data reception, antenna 210 receives signals from base stations and/or other transmitter stations and provides a received RF signal, which is routed through an antenna interface circuit 224 and presented as an input RF signal to a selected receiver, such as via a first input signal path 225 to receiver 230pa or via a second input signal path 235 to receiver 230pk. Antenna interface circuit 224 may include switches, duplexers, transmit filters, receive filters, matching circuits, etc. In a particular embodiment, one or more of the LNAs 240 may correspond to amplifier circuitry including triple-coupled inductors, as further described with reference to FIGS. 3-7. In the example of FIG. 2, an LNA 240pa within receiver 230pa is indicated as including (or being associated with) triple-coupled inductors, although more, fewer, and/or different amplifiers of the wireless device 110 may include (or be associated with) triple-coupled inductors in alternative embodiments.

The description below assumes that receiver 230pa is the selected receiver. Within receiver 230pa, the LNA 240pa amplifies the input RF signal and provides an output RF signal. Receive circuits 242pa downconvert the output RF signal from RF to baseband, amplify and filter the downconverted signal, and provide an analog input signal to data processor 280. Receive circuits 242pa may include mixers, filters, amplifiers, matching circuits, an oscillator, a local oscillator (LO) generator, a phase locked loop (PLL), etc. Each remaining receiver 230 in transceivers 220 and 222 may operate in similar manner as receiver 230pa.

In the exemplary design shown in FIG. 2, each transmitter 250 includes transmit circuits 252 and a power amplifier (PA) 254. For data transmission, data processor 280 processes (e.g., encodes and modulates) data to be transmitted and provides an analog output signal to a selected transmitter. The description below assumes that transmitter 250pa is the selected transmitter. Within transmitter 250pa, transmit circuits 252pa amplify, filter, and upconvert the analog output signal from baseband to RF and provide a modulated RF signal. Transmit circuits 252pa may include amplifiers, filters, mixers, matching circuits, an oscillator, an LO generator, a PLL, etc. A PA 254pa receives and amplifies the modulated RF signal and provides a transmit RF signal having the proper output power level. The transmit RF signal is routed through antenna interface circuit 224 and transmitted via antenna 210. Each remaining transmitter 250 in transceivers 220 and 222 may operate in similar manner as transmitter 250pa.

FIG. 2 shows an exemplary design of receiver 230 and transmitter 250. A receiver and a transmitter may also include other circuits not shown in FIG. 2, such as filters, matching circuits, etc. All or a portion of transceivers 220 and 222 may be implemented on one or more analog integrated circuits (ICs), RF ICs (RFICs), mixed-signal ICs, etc. For example, LNAs 240 and receive circuits 242 may be implemented on one module, which may be an RFIC, etc. The circuits in transceivers 220 and 222 may also be implemented in other manners.

Data processor/controller 280 may perform various functions for wireless device 110. For example, data processor 280 may perform processing for data being received via receivers 230 and data being transmitted via transmitters 250. Controller 280 may control the operation of the various circuits within transceivers 220 and 222. A memory 282 may store program codes and data for data processor/controller 280. Data processor/controller 280 may be implemented on one or more application specific integrated circuits (ASICs) and/or other ICs.

Wireless device 110 may support multiple band groups, multiple radio technologies, and/or multiple antennas. Wireless device 110 may include a number of LNAs to support reception via the multiple band groups, multiple radio technologies, and/or multiple antennas.

In an exemplary embodiment, an apparatus, such as the wireless device 110, may include a switchable high-pass amplifier with triple-coupled inductors. The apparatus may include circuitry (e.g., including the LNAs 240 of FIG. 2) that is switchable between multiple frequency bands (e.g., UHB/LTE-Unlicensed (LTEU)).

Figure 3:
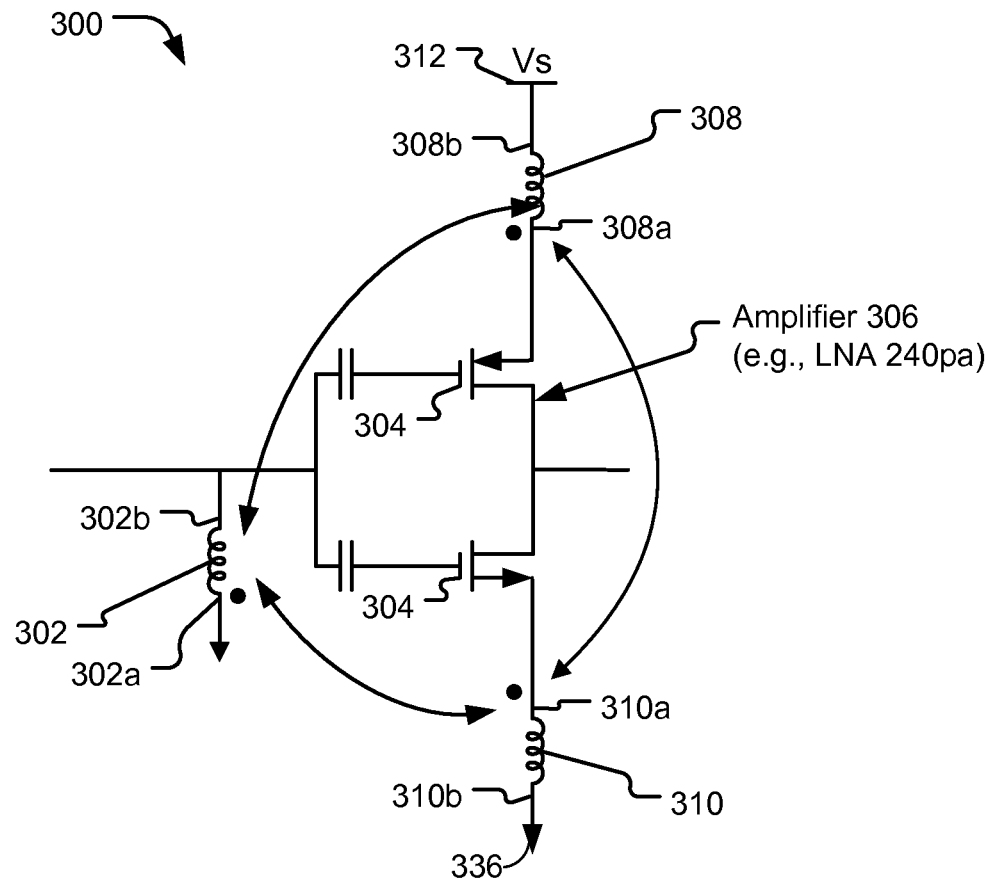
FIG. 3 shows a circuit diagram of an exemplary embodiment of an amplifier with triple-coupled inductors.

FIG. 3 illustrates an exemplary embodiment 300 of an amplifier 306 that is coupled to a triple-coupled arrangement of inductors. The amplifier 306 may be coupled to a first inductor, illustrated as a shunt inductor 302, a second inductor 308, and a third inductor 310. The shunt inductor 302 is coupled to an input of the amplifier 306 (e.g., coupled to gates 304 of an inverter-type LNA). A first terminal 302a of the shunt inductor 302 is connected to ground, and a second terminal 302b of the shunt inductor 302 is coupled to the input of the first amplifier 306. The shunt inductor 302 is inductively coupled to the second inductor 308, having terminals 308a and 308b coupled as shown, and to the third inductor 310, having terminals 310a and 310b coupled as shown. In an illustrative example, the inductors 308, 310 are degenerative inductors of a degeneration transformer as depicted in FIG. 3. The inductor 308 couples the first amplifier 306 to a first supply node 312 (e.g., a voltage supply (Vs)) and the inductor 310 couples the first amplifier 306 to a second supply node 336 (e.g., ground). Although the second supply node 336 is illustrated as a ground node, in other embodiments the second supply node 336 may provide a non-ground supply voltage. In FIG. 3, the polarity of each of the triple-coupled inductors 302, 308, 310 is denoted using dot-notation.

Figure 4:
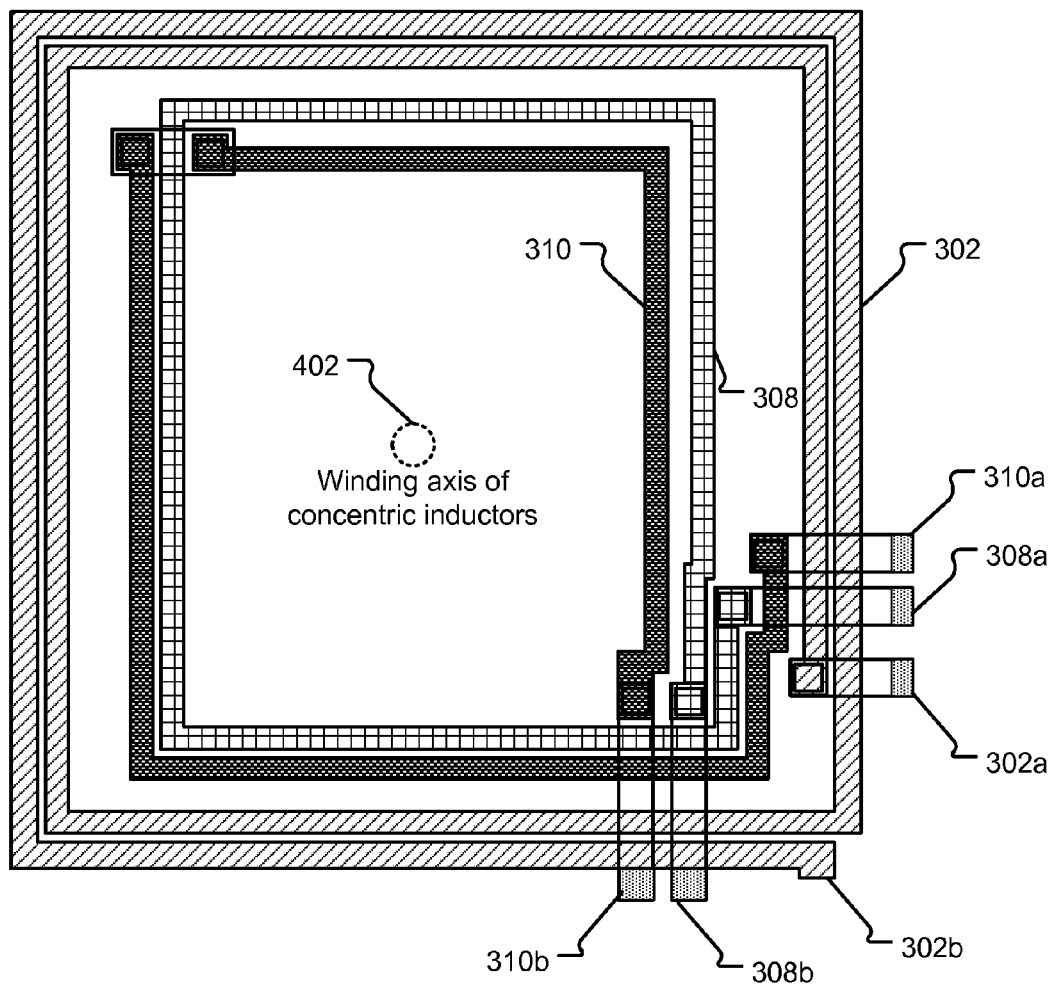
FIG. 4 shows a diagram of a triple-coupled exemplary inductor arrangement.

The triple-coupled inductor arrangement of the inductors 302, 308, 310 may be implemented in a small area by use of tightly coupled nested (e.g., concentric) loops. As an example an exemplary design shown in FIG. 4 depicts an arrangement of inductors that may be used to form a triple-coupled arrangement of the inductors 302, 308, and 310 within an area of 100×100 micrometers (um). As shown in FIG. 4, the inductors 302, 308, 310 may be nested to conserve area on a chip of a device, such as an RFIC that includes the transceiver 220 of FIG. 2. A winding axis (e.g., a common axis) of the concentric inductors 302, 308, 310 is shown in FIG. 4, at 402. In alternative embodiments, one or more of the inductors 302, 308, and 310 may be implemented using different arrangements of inductive windings than depicted in FIG. 4. For example, a different inductor than illustrated may be an innermost, middle, or outermost inductor of the triple-coupled inductor arrangement. As another example, terminals of the inductor(s) may be arranged differently.

Figure 5:
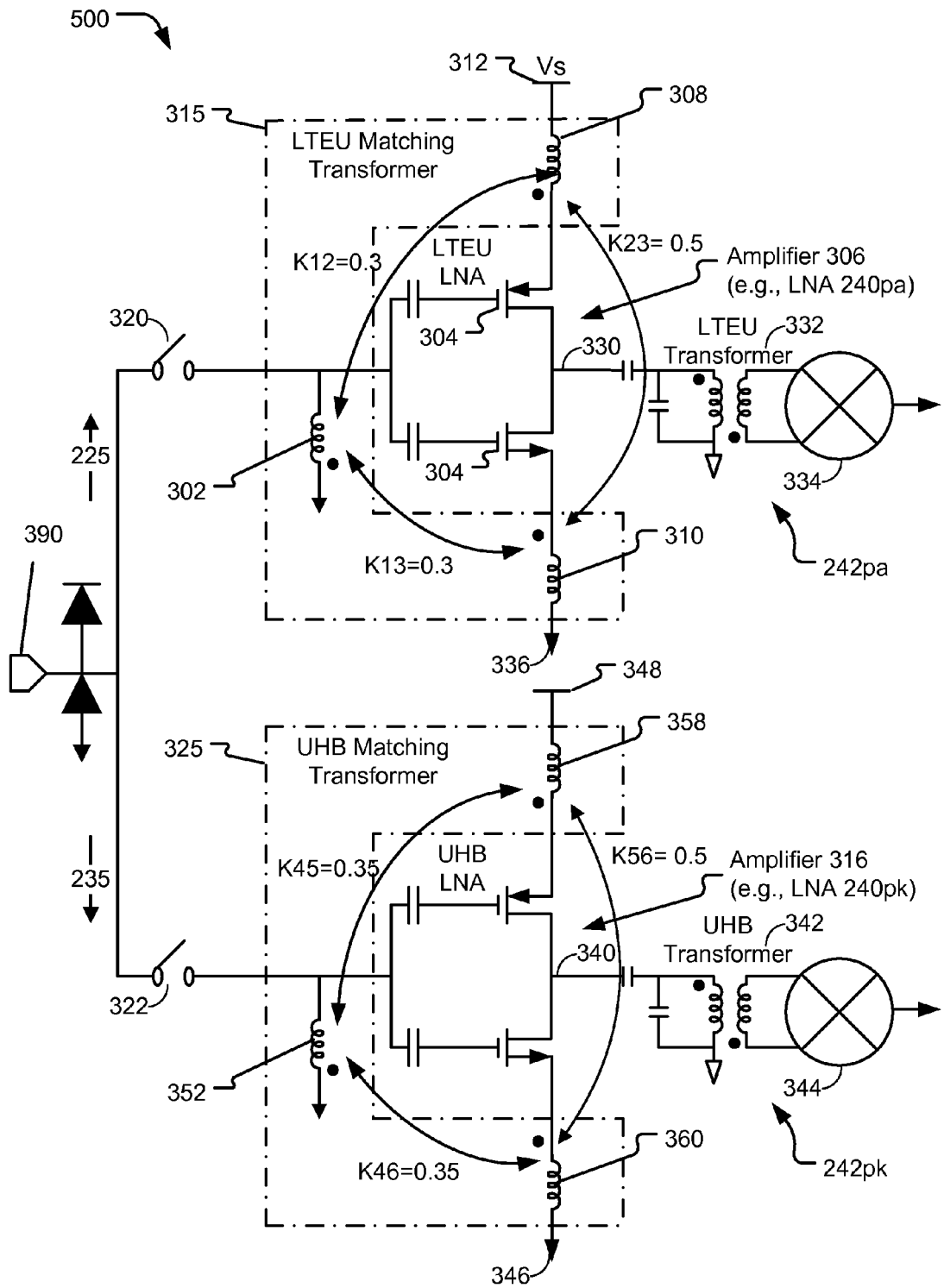
FIG. 5 shows a circuit diagram of an exemplary embodiment of a switchable amplifier with triple-coupled inductors.

FIG. 5 illustrates an exemplary embodiment 500 of circuitry that includes the amplifier 306 and a second amplifier 316, each of which is coupled to a respective triple-coupled arrangement of inductors. A first switch 320 selectively couples an input node 390 (e.g., a node internal to the antenna interface circuit 224 of FIG. 2) via the first input signal path 225 to an input of the first amplifier 306. A second switch 322 selectively couples the input node 390 to an input of the second amplifier 316. An output 330 of the first amplifier 306 is coupled to a first receiver circuit that includes a first transformer 332 and a first mixer 334. An output 340 of the second amplifier 316 is coupled to a second receiver circuit that includes a second transformer 342 and a second mixer 344. The first amplifier 306 and the first receiver circuit may correspond to the LNA 240*pa* and the receiver circuit 242*pa* of FIG. 2, respectively, and the second amplifier 316 and the second receiver circuit may correspond to the LNA 240*pk* and the receiver circuit 242*pk*, respectively.

The first amplifier 306 may be configured to operate on RF signals corresponding to a first frequency band (e.g., an LTEU frequency band). The first amplifier 306 may be coupled to a triple-coupled matching transformer (e.g., a triple-coupled LTEU matching transformer 315) that includes the first inductor, illustrated as the shunt inductor 302, the second inductor 308, and the third inductor 310. The shunt inductor 302 is coupled to an input of the first amplifier 306 (e.g., coupled to gates 304 of an inverter-type LNA). The shunt inductor 302 is inductively coupled to other inductors 308, 310 (e.g., inductors of a degeneration transformer as depicted in FIG. 5) to form the triple-coupled inductor arrangement. The inductor 308 couples the first amplifier 306 to the first supply node 312 (e.g., a voltage supply (Vs)) and the inductor 310 couples the first amplifier 306 to the second supply node 336 (e.g., ground). Although the second supply node 336 is illustrated as a ground node, in other embodiments the second supply node 336 may provide a non-ground supply voltage.

The second amplifier 316 may be configured to operate on RF signals corresponding to a second frequency band (e.g., a UHB frequency band). The second amplifier 316 may be coupled to a triple-coupled matching transformer (e.g., a triple-coupled UHB matching transformer 325) that includes a fourth inductor, illustrated as a shunt inductor 352, a fifth inductor 358, and a sixth inductor 360. The shunt inductor 352 is coupled to an input of the second amplifier 316 and is inductively coupled to the inductors 358, 360 to form the triple-coupled inductor arrangement. The inductor 358 couples the second amplifier 316 to a first supply node 348 (e.g., a voltage supply (Vs)) and the inductor 360 couples the second amplifier 316 to a second supply node 346 (e.g., ground). Although the second supply node 346 is illustrated as a ground node, in other embodiments the second supply node 346 may provide a non-ground supply voltage. In an illustrative example, the triple-coupled inductor arrangement of the inductors 352, 358, 360 is implemented in a small area by use of tightly coupled nested (e.g., concentric) loops, as shown in FIG. 4 with respect to the inductors 302, 308, 310.

The receive circuit coupled to the output 330 of the first amplifier 306 may be configured to process signals corresponding to the first frequency band (e.g., an LTEU frequency band). For example, the transformer 332 may be an LTEU transformer and the mixer 334 may be configured to down-mix an LTEU frequency band signal to a baseband signal or to an intermediate frequency signal. The receive circuit coupled to the output 340 of the second amplifier 316 may be configured to process signals corresponding to the second frequency band (e.g., a UHB frequency band). For example, the transformer 342 may be a UHB transformer and the mixer 344 may be configured to down-mix a UHB frequency band signal to a baseband signal or to an intermediate frequency signal.

The triple-coupled transformer arrangement corresponding to the first amplifier 306 includes the shunt inductor 302 being inductively coupled to the second inductor 308 with a first coupling coefficient K12. The shunt inductor 302 is also inductively coupled to the third inductor 310 with a second coupling coefficient K13. As illustrated in FIG. 5, the first coupling coefficient K12 and the second coupling coefficient K13 may have substantially the same value (e.g., K12=K13=0.3). The second inductor 308 is inductively coupled to the third inductor 310 with a third coupling coefficient K23 (e.g., K23=0.5). The value of an inductor coefficient K (e.g., K12, K13, and/or K23) may be selected and/or modified to tune an impedance of the first amplifier 306. Although FIG. 5 illustrates the first coupling coefficient K12 and the second coupling coefficient K13 as having substantially the same value, in other embodiments the first coupling coefficient K12 may differ from the second coupling coefficient K13. The polarity of each of the triple-coupled inductors 302, 308, 310 is denoted using dot-notation in FIG. 5.

Similarly, the triple-coupled transformer arrangement corresponding to the second amplifier 316 includes the shunt inductor 352 being inductively coupled to the fifth inductor 358 with a fourth coupling coefficient K45. The shunt inductor 352 is also inductively coupled to the sixth inductor 360 with a fifth coupling coefficient K46. As illustrated in FIG. 5, the fourth coupling coefficient K45 and the fifth coupling coefficient K46 may have substantially the same value (e.g., K45=K46=0.35). The fifth inductor 358 is inductively coupled to the sixth inductor 360 with a sixth coupling coefficient K56 (e.g., K56=0.5). The value of K45, K46, and/or K56 may be selected and/or modified to tune an impedance of the second amplifier 316. Although FIG. 5 illustrates the fourth coupling coefficient K45 and the fifth coupling coefficient K46 as having substantially the same value, in other embodiments the fourth coupling coefficient K45 may differ from the fifth coupling coefficient K46.

The triple-coupled inductor arrangements illustrated in FIG. 5 may improve one or more operating characteristics of the amplifiers 306, 316. For example, coupling the shunt inductor 302 to the degeneration inductors 308, 310 may improve the linearity of the first amplifier 306. To illustrate, high-pass filter matching may filter lower side jammer and improve out of band (OOB) second order intercept point (IIP2) and/or third order intercept point (IIP3) (IIP2/IIP3) performance measures. Improvement in OOB IIP2/IIP3 indicates improved linearity of the first amplifier 306. Similarly, the triple-coupled arrangement of the inductors 352, 358, and 360 may improve the linearity of the second amplifier 316.

In contrast to certain high-pass matching circuits that use a series capacitor (coupled to a gate of the amplifier) and that use a shunt inductor, by tuning inductive coupling (K) between the shunt inductor 302 and the degeneration inductors 308, 310 in the circuit of FIG. 5, the matching transformer 315 may be designed to provide sufficient impedance matching to omit a series capacitor coupled to the gate of the amplifier, thereby further reducing circuit area.

FIG. 5 therefore illustrates the first amplifier 306 configured to amplify signals in a first frequency band (e.g., a LNA for LTE) and the second amplifier 316 configured to amplify signals in a second frequency band (e.g., a LNA for UHB). Each amplifier 306, 316 uses a triple-coupled inductor arrangement as described above. A shunt inductor 302 is coupled to degeneration inductors 308, 310 (i.e., triple-coupled) to improve linearity of the first amplifier 306, to perform impedance matching, and to reduce area. A shunt inductor 352 is coupled to degeneration inductors 358, 360 (i.e., triple-coupled) to improve linearity of the second amplifier 316, to perform impedance matching, and to reduce area. Thus, a switchable multi-band amplification circuit that consumes less area by using triple-coupled inductors is provided.

Figure 6:
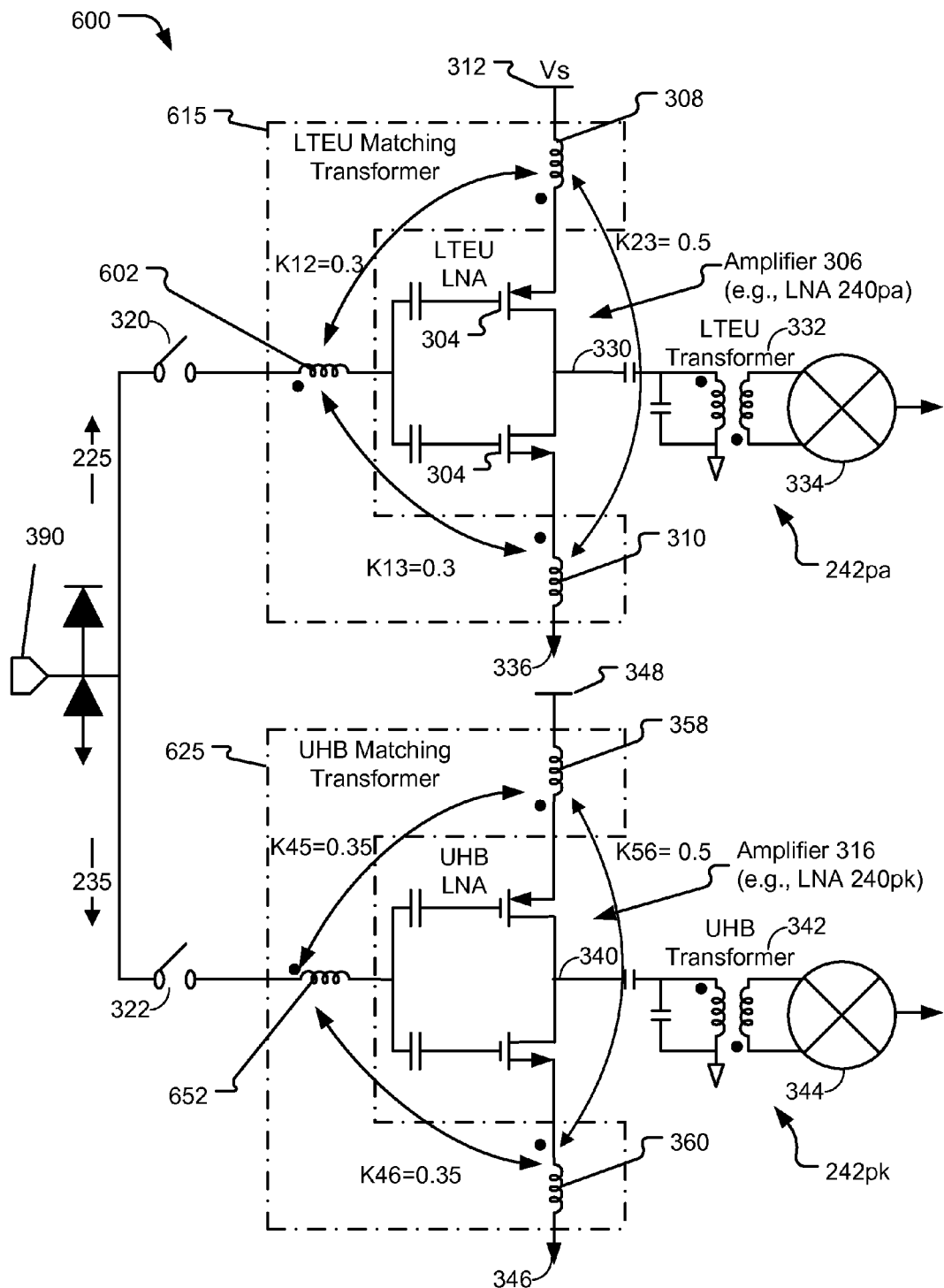
FIG. 6 shows a circuit diagram of another exemplary embodiment of a switchable amplifier with triple-coupled inductors.

Although FIG. 5 illustrates each of the shunt inductors 302, 352 as being coupled between an amplifier input and ground, in other exemplary embodiments one or both of the shunt inductors 302, 352 may be replaced by a series inductor coupled between the input node 390 and an amplifier input, such as described in further detail with respect to FIG. 6. Although FIG. 5 illustrates that the amplifiers 306, 316 are selectively coupled to the input node 390 via the switches 320, 322 (e.g., amplifier selection may be controlled via control signals from the data processor/controller 280 of FIG. 2 based on an operating mode (e.g., LTEU/UHB)), in other embodiments one or both of the switches 320, 322 may be omitted, such as a configuration in which the amplifiers 306, 316 are coupled to separate signal output nodes of the antenna interface circuit 224 of FIG. 2. Although FIG. 5 illustrates that two amplifiers 306, 316 are selectively coupled to the input node 390, in other embodiments, three or more amplifiers may be selectively coupled to and decoupled from the input node 390 via one or more switching elements, such as via a demultiplexer circuit.

FIG. 6 illustrates an exemplary embodiment 600 of the amplifiers 306, 316 of FIG. 5 using series-coupled inductors 602, 652 in place of the shunt inductors 302, 352 of FIG. 5. The first switch 320 selectively couples the input node 390 via the first input signal path 225 to a first terminal (e.g., a positive terminal) of a first series-coupled inductor 602 to receive an input signal. A second terminal (e.g., a negative terminal) of the first series-coupled inductor 602 is coupled to an input of the first amplifier 306. The second switch 322 selectively couples the input node 390 via the second input signal path 235 to a first terminal of a second series-coupled inductor 652. A second terminal of the second series-coupled inductor 652 is coupled to the input of the second amplifier 316. The output 330 of the first amplifier 306 is coupled to the first receiver circuit that includes the first transformer 332 and the first mixer 334. The output 340 of the second amplifier 316 is coupled to the second receiver circuit that includes the second transformer 342 and the second mixer 344.

The first amplifier 306 is coupled to a triple-coupled matching transformer 615 that includes the first series-coupled inductor 602, the second inductor 308, and the third inductor 310. The second amplifier 316 is coupled to a triple-coupled matching transformer 625 that includes the second series-coupled inductor 652, the fifth inductor 358, and the sixth inductor 360.

The triple-coupled inductor arrangement of the inductors 602, 308, 310 for the first amplifier 306 and the triple-coupled inductor arrangement of the inductors 652, 358, and 360 for the second amplifier 316 may be implemented in a small area (e.g., see FIG. 4) by use of tightly coupled nested (e.g., concentric) loops. As an example, the inductors 602, 308, and 310 of the first amplifier 306 may be arranged as shown in FIG. 4 in a triple-coupled arrangement within an area of 100×100 micrometers (um). In alternative embodiments, different ones of the inductors 602, 308, and 310 may be the innermost, middle, and outermost inductors of the triple-coupled arrangement shown in FIG. 4 and/or one or more of the inductors 602, 308, and 310 may be implemented using different arrangements of inductive windings than depicted in FIG. 4.

The triple-coupled inductor arrangements illustrated in FIG. 6 may improve one or more operating characteristics of the amplifiers 306, 316. For example, the triple-coupled inductor arrangements of FIG. 6 may improve amplifier linearity in a similar manner as described with respect to FIG. 5. However, in contrast to the shunt inductors 302, 352 of FIG. 5 that provide high-pass filter matching as lower-frequency components are shunted to ground, the series-coupled inductors 602, 652 of FIG. 6 may instead provide high-frequency jammer blocking as higher-frequency components are blocked by the series inductance at the amplifier input.

Figure 7:
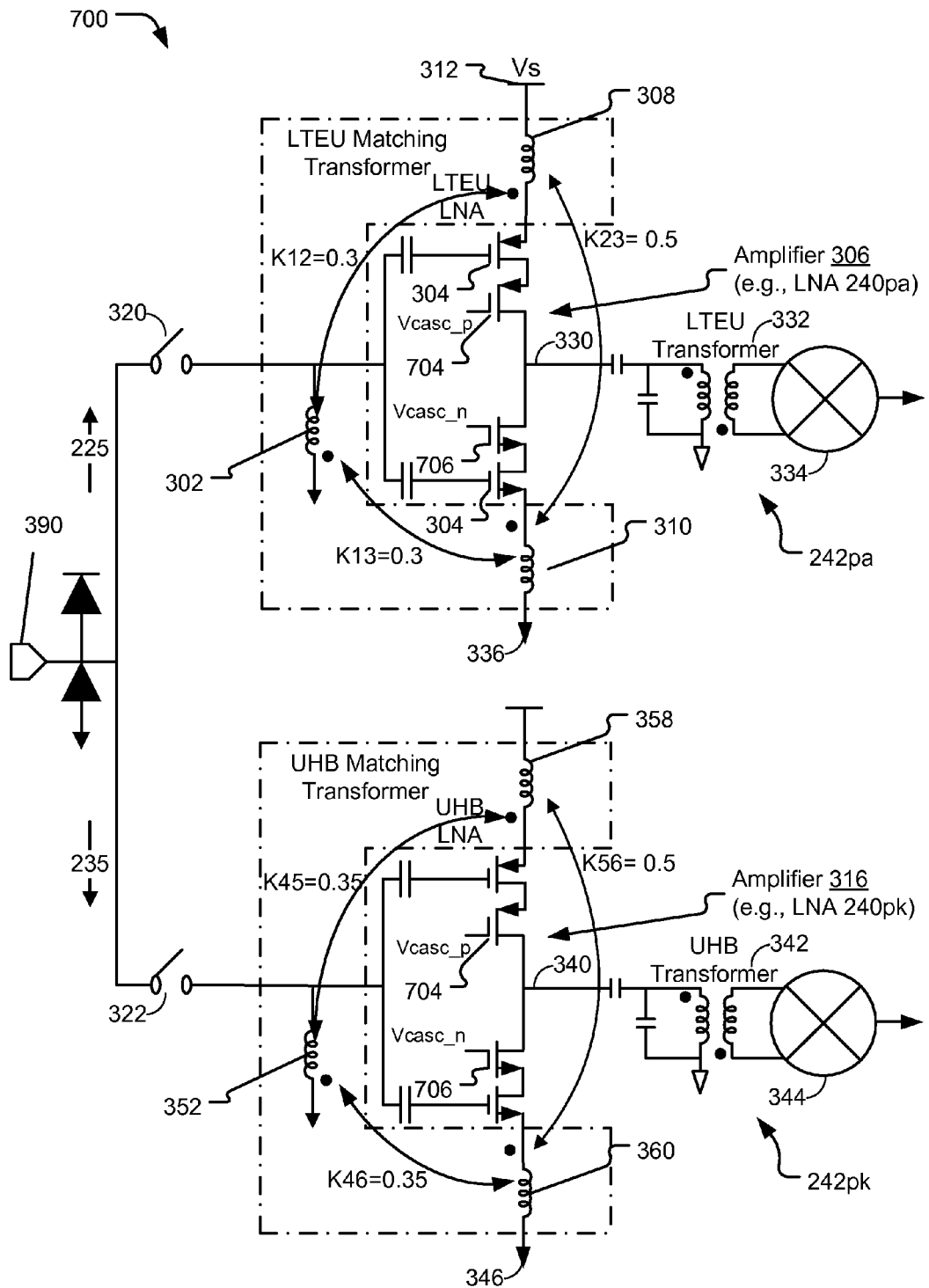
FIG. 7 shows a circuit diagram of another exemplary embodiment of a switchable amplifier with triple-coupled inductors.

FIG. 7 illustrates another exemplary embodiment 700 of a system including the first amplifier 306 and the second amplifier 316 of FIG. 5 having a cascode configuration. The first switch 320 is configured to selectively couple the input node 390 via the first input signal path 225 to the shunt inductor 302 coupled to the input of the first amplifier 306. The second switch 322 may selectively couple the input node 390 via the second input signal path 235 to the second amplifier 316. The output 330 of the first amplifier 306 is coupled to the first receiver circuit that includes the first transformer 332 and the first mixer 334. The output 340 of the second amplifier 316 is coupled to the second receiver circuit that includes the second transformer 342 and the second mixer 344.

The first amplifier 306 includes a first cascode transistor 704 (e.g., a p-type transistor such as a p-type metal oxide semiconductor (PMOS) transistor) and a second cascade transistor 706 (e.g., an n-type transistor such as an N-type MOS (NMOS) transistor). The first cascode transistor 704 may be biased by a first bias voltage Vcasc_p and the second cascode transistor 706 may be biased by a second bias voltage Vcasc_n. The cascode transistors 704, 706 may increase an output impedance of the first amplifier 306 and may improve input/output isolation of the first amplifier 306. The second amplifier 316 of FIG. 5 also includes cascode transistors 704, 706 having a cascode configuration similar to the first amplifier 306.

Although FIG. 7 depicts the cascode configuration of the first amplifier 306 coupled to the triple-coupled matching transformer that includes the shunt inductor 302, in other embodiments the cascode amplifier configuration may be coupled to a triple-coupled matching transformer that includes a series-coupled inductor. For example, the first cascode transistor 704 and the second cascode transistor 706 may be included in the first amplifier 306 and/or the second amplifier 316 of FIG. 6.

Figure 8:
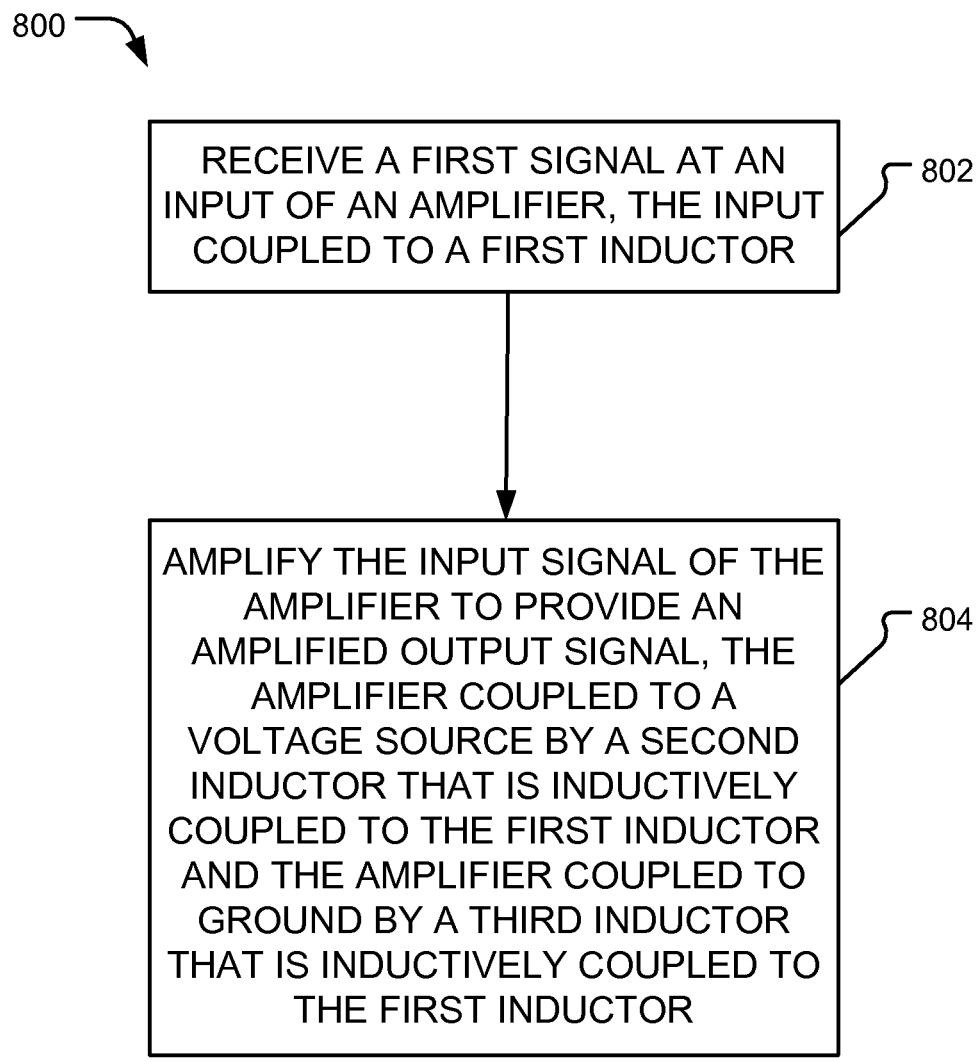
FIG. 8 illustrates a flowchart of a method of signal amplification using an amplifier structure with triple-coupled inductors.

An exemplary method 800 of signal amplification is shown in FIG. 8. The method 800 may include receiving a first signal at an input of an amplifier, at 802. The input may be coupled to a first inductor. For example, referring to FIG. 5, a signal may be received at the input of the first amplifier 306 via the first input signal path 225. The input of the first amplifier 306 is coupled to the first inductor 302.

The method 800 may also include amplifying the input signal of the amplifier to provide an amplified output signal, at 804. The amplifier may be coupled to a voltage source by a second inductor that is inductively coupled to the first inductor. For example, referring to FIG. 5, during operation, the first amplifier 306 amplifies an input signal and provides an amplified output signal at the output 330. The first amplifier 306 is coupled to the supply node (e.g., voltage source) 312 by the second inductor 308 that is inductively coupled to the first inductor 302. The amplifier may also be coupled to ground by a third inductor that is inductively coupled to the first inductor. For example, referring to FIG.

5, the first amplifier 306 is coupled to ground by the third inductor 310 that is inductively coupled to the first inductor 302. As another example, referring to FIG. 6, the first amplifier 306 is coupled to ground by the third inductor 310 that is inductively coupled to the first series-coupled inductor 602. The amplified output signal may be provided from the first amplifier 306 to a transformer, such as the transformer 332 of FIG. 5.

The method 800 may also include amplifying a second signal at a second amplifier. For example, referring to FIG. 5, a second signal may be received at the input of the second amplifier 316 via the second input signal path 235. The first signal may be an LTE frequency band signal and the second signal may be a UHB signal.

Amplifying the input signal at an amplifier that is coupled to three inductors in a triple-coupled configuration, such as the first amplifier 306 coupled to the shunt inductor 302 and the degeneration inductors 308, 310 of FIG. 3 and FIG. 5, may result in improved output signal characteristics due to enhanced linearity and/or impedance matching of the amplifier. The triple-coupled configuration of the inductors may further reduce area usage on a chip or device, such as an RFIC that includes the transceiver 220 of FIG. 2.

In conjunction with the described embodiments, an apparatus may include means for amplifying a signal at an input of the means for amplifying. For example, the means for amplifying may include the LNA 240 of FIG. 2, the first amplifier 306 of FIG. 3, FIG. 5, FIG. 6, or FIG. 7, the second amplifier 316 of FIG. 5, FIG. 6, or FIG. 7, one or more other devices, circuits, or any combination thereof.

The apparatus may also include first means for coupling the means for amplifying to a first supply node. For example, the first means for coupling may include the inductor 308 of FIG. 3, FIG. 4, FIG. 5, FIG. 6, or FIG. 7, the inductor 358 of FIG. 5 or FIG. 6, one or more other devices, circuits, or any combination thereof.

The apparatus may further include second means for coupling the means for amplifying to a second supply node. For example, the second means for coupling may include the inductor 310 of FIG. 3, FIG. 4, FIG. 5, FIG. 6, or FIG. 7, the inductor 360 of FIG. 5, FIG. 6, or FIG. 7, one or more other devices, circuits, or any combination thereof.

The apparatus may also include means for providing an inductance at the input of the means for amplifying. The means for providing the inductance may be inductively coupled to the first means for coupling and to the second means for coupling. For example, the means for providing an inductance may include the inductor 302 of FIG. 3, FIG. 5, or FIG. 7, the inductor 352 of FIG. 3, FIG. 5, or FIG. 7, the inductor 602 of FIG. 6, the inductor 652 of FIG. 6, one or more other devices, circuits, or any combination thereof.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
   an amplifier;
   a first inductor having a first terminal and a second terminal, wherein the first terminal is coupled to an input of the amplifier, and wherein the second terminal is coupled to a ground potential;
   a second inductor configured to be inductively coupled to the first inductor and that couples the amplifier to a first supply node corresponding to a voltage supply; and
   a third inductor configured to be inductively coupled to the first inductor and to the second inductor and that couples the amplifier to a second supply node corresponding to the ground potential.

2. The apparatus of claim 1, wherein the first inductor is connected to the input of the amplifier, wherein the second inductor comprises a second degenerative inductor that is connected to the amplifier and to the first supply node, wherein the third inductor comprises a third degenerative inductor that is connected to the amplifier and to the second supply node, and wherein the second inductor is configured to be electrically coupled to the third inductor via at least one transistor of the amplifier.

3. The apparatus of claim 1, wherein an inductor coefficient represents a magnitude of an inductive coupling of the second inductor to the first inductor and of the third inductor to the first inductor, and wherein the first inductor, the second inductor, and the third inductor correspond to concentric nested loops.

4. The apparatus of claim 1, wherein a value of an inductor coefficient is modified to tune an impedance of the amplifier, the inductor coefficient associated with a magnitude of inductive coupling of the first inductor to the second inductor or to the third inductor.

5. The apparatus of claim 1, wherein the first inductor comprises a shunt inductor, wherein the first inductor, the second inductor, and the third inductor comprise a transformer, wherein an impedance of the transformer corresponds to a frequency band of the amplifier, and wherein the frequency band corresponds to a long term evolution unlicensed (LTEU) frequency band or an ultra-high frequency band (UHB).

6. The apparatus of claim 1, wherein the first inductor comprises a series coupled inductor, wherein the second inductor is configured to be inductively coupled to the first inductor such that a change in a first current through the second inductor will induce a first voltage across the first inductor that is proportional to the change in the first current, and wherein the third inductor is configured to be inductively coupled to the first inductor and to the second inductor such that a change in a second current through the third inductor will induce a second voltage across the first inductor and a third voltage across the second inductor, the second voltage and the third voltage proportional to the change in the second current.

7. The apparatus of claim 6, wherein a first polarity of the first inductor is the same as a second polarity of the second inductor, wherein the first polarity is opposite to a third polarity of the third inductor, and wherein a negative terminal of the series coupled inductor is coupled to the input of the amplifier, and wherein another terminal of the series coupled inductor is coupled to receive an input signal.

8. The apparatus of claim 1, further comprising:
a second amplifier including a first transistor and a second transistor;
a fourth inductor coupled to an input of the second amplifier and coupled to ground;
a fifth inductor configured to be inductively coupled to the fourth inductor; and
a sixth inductor configured to be inductively coupled to the fourth inductor and to the fifth inductor, wherein the fifth inductor is configured to be electrically coupled to the sixth inductor via the first transistor and the second transistor, wherein an output of the second amplifier is positioned between the first transistor and the second transistor, and wherein the first transistor and the second transistor are configured to electrically couple the fifth inductor and the sixth inductor such that a current path extends from a power supply to the ground via the fifth inductor, the first transistor, the second transistor, and the sixth inductor.

9. The apparatus of claim 1, further comprising a second amplifier, wherein the amplifier comprises a first low noise amplifier (LNA) and the second amplifier comprises a second LNA, wherein the first LNA is configured to amplify signals in a first frequency band and the second LNA is configured to amplify signals in a second frequency band, wherein the second inductor is configured to be inductively coupled to the first inductor with a first coupling coefficient, and wherein the third inductor is configured to be inductively coupled to the first inductor with a second coupling coefficient that is substantially the same as the first coupling coefficient.

10. The apparatus of claim 9, wherein the amplifier is configured to operate in a first frequency band corresponding to a long term evolution (LTE) frequency band, and wherein the second amplifier is configured to operate in a second frequency band comprising an ultra high frequency band (UHB).

11. The apparatus of claim 1, wherein the first inductor, the second inductor, and the third inductor form a triple-coupled inductor.

12. The apparatus of claim 9, wherein the first LNA is coupled to an output of an antenna interface circuit via a first switch and the second LNA is coupled to the output of the antenna interface circuit via a second switch.

13. The apparatus of claim 9, wherein the first LNA is coupled via a first transformer to a first mixer and the second LNA is coupled via a second transformer to a second mixer.

14. The apparatus of claim 1, wherein the second inductor is configured to be inductively coupled to the first inductor with a first coupling coefficient of at least 0.3, and wherein the amplifier, the first inductor, the second inductor, and the third inductor are incorporated into a wireless communication device.

15. A method of signal amplification, the method comprising:
receiving a signal at an input of an amplifier, the input coupled to a first terminal of a first inductor, wherein the first inductor has a second terminal coupled to a ground potential; and
amplifying the signal at the amplifier to provide an amplified output signal, the amplifier coupled to a first supply node by a second inductor configured to be inductively coupled to the first inductor and the amplifier coupled to a second supply node by a third inductor configured to be inductively coupled to the first inductor, wherein the first supply node corresponds to a voltage supply, and wherein the second supply node corresponds to the ground potential.

16. The method of claim 15, further comprising:
tuning a first inductive coefficient and a second inductive coefficient such that a first value of the first inductive coefficient matches a second value of the second inductive coefficient, wherein the first inductive coefficient corresponds to a first magnitude of a first inductive coupling of the first inductor and the second inductor, and wherein the second inductive coefficient corresponds to a second magnitude of a second inductive coupling of the first inductor and the third inductor; and
amplifying a second signal at a second amplifier, wherein the signal comprises a long term evolution (LTE) frequency band signal and the second signal comprises an ultra high frequency band (UHB) signal.

17. An apparatus comprising:
means for amplifying a signal, wherein the means for amplifying is configured to amplify signals in a first frequency band;
first means for coupling the means for amplifying to a first supply node;
second means for coupling the means for amplifying to a second supply node; and
means for providing an inductance at the input, the means for providing the inductance configured to be inductively coupled to the first means for coupling and to the second means for coupling; and
second means for amplifying configured to amplify signals in a second frequency band, wherein the means for amplifying, the first means for coupling, the second means for coupling, the means for providing the inductance, and the second means for amplifying are incorporated into a wireless communication device.

18. The apparatus of claim 17, wherein the first supply node corresponds to a voltage supply, and wherein the second supply node corresponds to ground.

19. An apparatus comprising:
an amplifier;
a first inductor coupled to an input of the amplifier;
a second inductor configured to be inductively coupled to the first inductor, wherein the second inductor couples the amplifier to a first supply node; and
a third inductor configured to be inductively coupled to the first inductor and to the second inductor, wherein the third inductor couples the amplifier to a second supply node, and wherein the first inductor, the second inductor, and the third inductor correspond to concentric nested loops.

20. The apparatus of claim 19, wherein the first inductor corresponds to an outermost loop of the concentric nested loops, wherein the third inductor corresponds to an innermost loop of the concentric nested loops, and wherein the second inductor corresponds to a loop positioned between the outermost loop and the innermost loop.

\* \* \* \* \*